(12) United States Patent
Hung et al.

(10) Patent No.: US 11,844,199 B2
(45) Date of Patent: Dec. 12, 2023

(54) ELECTRONIC DEVICE

(71) Applicant: Advanced Semiconductor Engineering, Inc., Kaohsiung (TW)

(72) Inventors: Li-Chieh Hung, Kaohsiung (TW); Chen-Chao Wang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 129 days.

(21) Appl. No.: 17/585,416

(22) Filed: Jan. 26, 2022

(65) Prior Publication Data

US 2023/0240057 A1 Jul. 27, 2023

(51) Int. Cl.
H05K 1/18 (2006.01)
H05K 7/20 (2006.01)
H05K 1/02 (2006.01)

(52) U.S. Cl.
CPC .......... H05K 7/209 (2013.01); H05K 1/0216 (2013.01); H05K 1/181 (2013.01)

(58) Field of Classification Search
CPC ....... H05K 7/209; H05K 1/0216; H05K 1/181
See application file for complete search history.

(56) References Cited

U.S. PATENT DOCUMENTS

| | | | |
|---|---|---|---|
| 9,595,514 B2 | 3/2017 | Bruno et al. | |
| 9,935,076 B1 | 4/2018 | Ramachandran et al. | |
| 11,004,783 B2 | 5/2021 | Calugaru | |
| 2004/0027802 A1* | 2/2004 | Duerbaum | H05K 7/1092 361/688 |
| 2006/0043581 A1* | 3/2006 | Prokofiev | H01L 23/49838 257/691 |
| 2012/0293972 A1 | 11/2012 | Pan et al. | |
| 2020/0075553 A1 | 3/2020 | Delacruz et al. | |
| 2020/0373285 A1* | 11/2020 | Hovis | H05K 1/0231 |
| 2020/0381351 A1* | 12/2020 | Calugaru | G06F 1/183 |
| 2021/0249384 A1 | 8/2021 | Kim et al. | |
| 2022/0068782 A1* | 3/2022 | Cheah | H01L 23/49833 |

* cited by examiner

*Primary Examiner* — Sherman Ng
(74) *Attorney, Agent, or Firm* — FOLEY & LARDNER LLP (57) ABSTRACT

An electronic device is disclosed. The electronic device includes a first electronic component, a first power regulator disposed above the first electronic component. The first power regulator is configured to receive a first power along a lateral surface of the first electronic component without passing the first electronic component and to provide a second power to the first electronic component. The electronic device also includes a passive component disposed in an electrical path between the first electronic component and the first power regulator.

20 Claims, 5 Drawing Sheets

ELECTRONIC DEVICE

BACKGROUND

1. Field of the Disclosure

The present disclosure relates to an electronic device, and in particular to an electronic device having an electronic component and a power regulator.

2. Description of the Related Art

System-in-Package (SiP) technology leverages integrated circuit (IC) assembly capabilities, including wafer level packaging, fan-out wafer level packaging, 2.5D/3D IC, etc., to integrate multiple chips or components into a package. Since different voltages should be provided for components in a package having different functions, a power regulating device may be used to provide different types of power control.

The power routing path for the power regulating device is usually provided by a substrate and/or package routing features (such as conductive vias and pads) in the package. A long power routing path through the substrate may cause a significant voltage drop and degrade the performance thereof. When input voltage decreases, voltage drops may become an issue.

SUMMARY

In some embodiments, an electronic device includes a first electronic component, a first power regulator disposed above the first electronic component. The first power regulator is configured to receive a first power along a lateral surface of the first electronic component without passing the first electronic component and to provide a second power to the first electronic component. The electronic device also includes a passive component disposed in an electronical path between the first electronic component and the first power regulator.

In some embodiments, an electronic device includes a first electronic component and a first power regulator disposed above the first electronic component. The electronic device also includes an encapsulant covering the first electronic component and exposing a top surface of the first electronic component. The first power regulator is configured to receive a first power passing the encapsulant and to provide a second power to the first electronic component.

In some embodiments, an electronic device includes a first electronic component and a first power regulator disposed above and exposing a portion of the first electronic component. The electronic device also includes a heat sink disposed on the portion of the first electronic component and the first power regulator. The heat sink is configured to dissipate heat from the first electronic component and the first power regulator to external of the electronic device.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
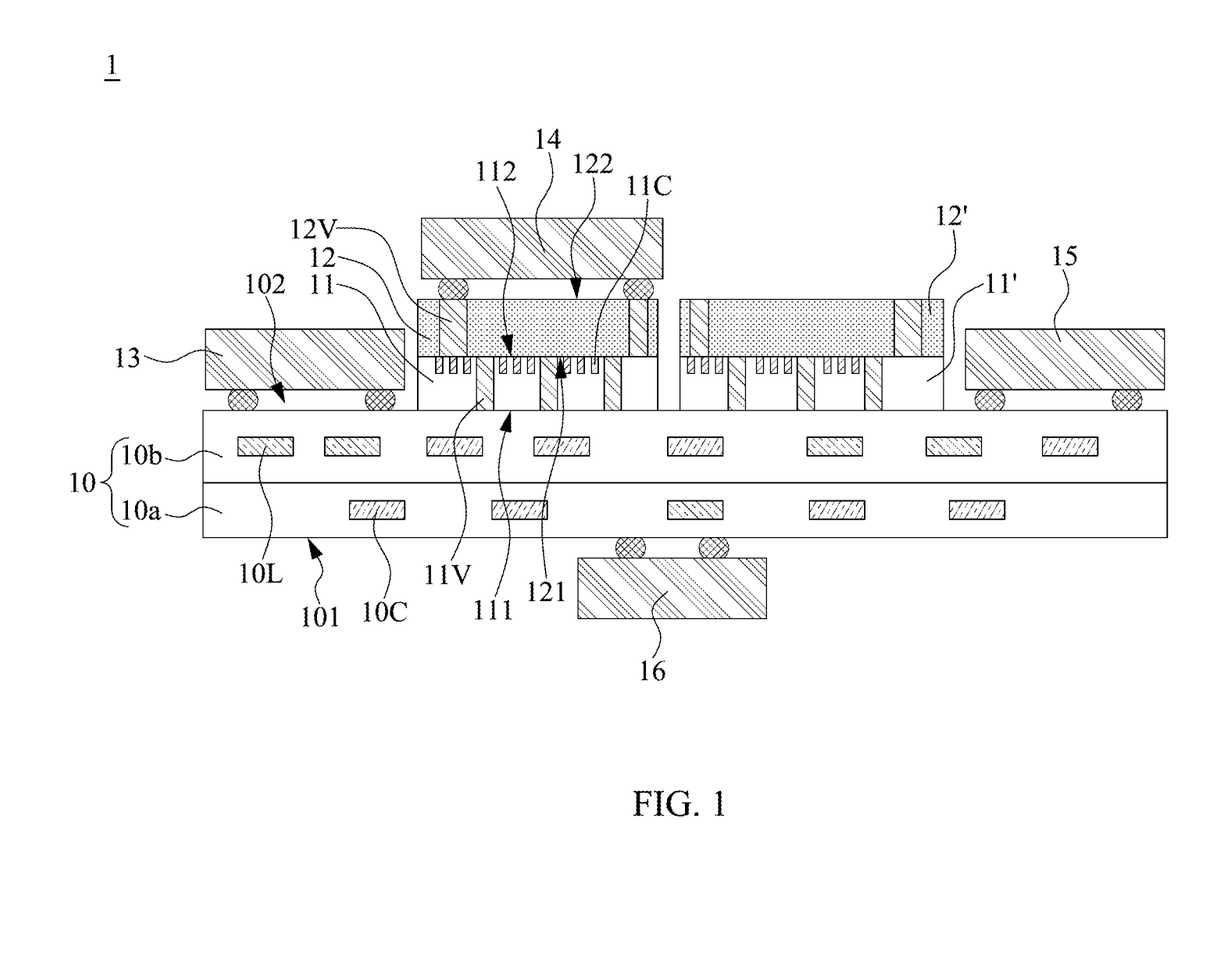
FIG. 1 illustrates a cross-sectional view of an example of an electronic device according to some embodiments of the present disclosure.

FIG. 1 illustrates a cross-sectional view of an example of an electronic device 1 according to some embodiments of the present disclosure. In some embodiments, the electronic device 1 may include a package, such as a semiconductor device package. In some embodiments, the electronic device 1 may include a carrier 10, interconnection structures 11, 11', active devices 12, 12', and power regulating devices 13, 14, 15, and 16.

In some embodiments, the carrier 10 may include, for example, a printed circuit board (PCB), such as a paper-based copper foil laminate, a composite copper foil laminate, or a polymer-impregnated glass-fiber-based copper foil laminate. In some embodiments, the carrier 10 may include a semiconductor substrate 10a and a redistribution layer (RDL) 10b disposed on the semiconductor substrate 10a. The semiconductor substrate 10a may include silicon, germanium, or other suitable materials. The RDL 10b may provide a fan-out horizontal electrical path for the carrier 10.

In some embodiments, the carrier 10 may include a surface 101 and a surface 102 opposite to the surface 101. The carrier 10 may include one or more conductive pads (not shown) in proximity to, adjacent to, or embedded in and exposed from the surface 101 and/or 102 of the carrier 10. The carrier 10 may include a solder resist (not shown) on the surface 101 and/or 102 of the carrier 10 to fully expose or to expose at least a portion of the conductive pads for electrical connections, including, for example, the power routing path (or the power path) and the signal routing path (or the signal path) in the electronic device 1.

In some embodiments, the carrier 10 may provide power and/or ground connections to the devices or components electrically connected with the carrier 10. For example, the carrier 10 may have a connector or terminal configured to be electrically connected with a power source or a power supply (not illustrated in the figures). The carrier 10 may provide a power path (such as through the RDL 10*b*) between the power supply and the power regulating device (such as one of the power regulating devices 13, 14, 15, and 16), which in turn may provide regulated power to the active device (such as one of the active devices 12 and 12') electrically connected with the carrier 10.

In some embodiments, the interconnection structure 11 and/or the interconnection structure 11' may be disposed on the surface 102 of the carrier 10. In some embodiments, the interconnection structure 11 and the interconnection structure 11' may each include an interposer. In some embodiments, the interconnection structure 11 and the interconnection structure 11' may each include, for example, a printed circuit board, such as a paper-based copper foil laminate, a composite copper foil laminate, or a polymer-impregnated glass-fiber-based copper foil laminate. The interconnection structure 11 and the interconnection structure 11' may each include, for example, silicon (Si), glass or other suitable materials. The interconnection structure 11 and the interconnection structure 11' may each include, for example, a circuitry. The interconnection structure 11 and the interconnection structure 11' may each include, for example, a redistribution layer structure.

In some embodiments, the interconnection structure 11 may include a surface 111, and a surface 112 opposite to the surface 111. In some embodiments, the interconnection structure 11 may include a conductive via 11V, such as a Through-Silicon Via (TSV). In some embodiments, the conductive via 11V may extend between the surface 111 and the surface 112. In some embodiments, the conductive via 11V may be electrically connected with the carrier 10 (such as with the RDL 10*b*) through an electrical contact, such as solder balls. In some embodiments, the conductive via 11V may provide electrical connections between the carrier 10 and the active device 12. Similarly, a conductive via may penetrate through the interconnection structure 11' to provide electrical connections between the carrier 10 and the active device 12'.

In some embodiments, the interconnection structure 11 may be a part of the power path between the active device 12 and the power regulating device (such as one of the power regulating devices 13, 14, 15, and 16). Similarly, the interconnection structure 11' may be a part of the power path between the active device 12 and the power regulating device (such as one of the power regulating devices 13, 14, 15, and 16).

The positions and number of the interconnection structures in the electronic device 1 are not intended to limit the present disclosure. For example, there may be any number of the interconnection structures in the electronic device 1 due to design requirements. For example, the interconnection structure 11' may be omitted. For example, the active device 12 and the active device 12' may both be disposed on (over, or above) the interconnection structure 11. For example, the interconnection structure 11 and the interconnection structure 11' may be omitted. For example, the active device 12 and the active device 12' may both be directly disposed on the carrier 10.

In some embodiments, the active device 12 may be disposed on the interconnection structure 11. In some embodiments, the active device 12 may be electrically connected with the carrier 10 through the interconnection structure 11. In some embodiments, the active device 12 may be electrically connected with the interconnection structure 11 through an electrical contact, such as solder balls. In some embodiments, the active device 12 may be electrically connected with the interconnection structure 11 by way of flip-chip or wire-bond techniques. Similarly, the active device 12' may be disposed on the interconnection structure 11' and electrically connected with the carrier 10 through the interconnection structure 11'.

In some embodiments, the active device 12 and the active device 12' may be circuits or circuit elements that rely on an external power supply to control or modify electrical signals. For example, the active device 12 and the active device 12' may each include a processor, a controller, a memory, or an input/output (I/O) buffer, etc.

In some embodiments, the active device 12 and the active device 12' may each include an electronic component. In some embodiments, the active device 12 and the active device 12' may each include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit.

In some embodiments, the active device 12 and the active device 12' may have different functions. In some embodiments, the active device 12 and the active device 12' may have the same or a similar function. In some embodiments, the active device 12 and the active device 12' may be dedicated to processing different signals. For example, the active device 12' may be dedicated to processing a high-speed signal.

In some embodiments, the active device 12 may include a surface 121 facing the carrier 10 and a surface (or a top surface) 122 opposite to the surface 121. In some embodiments, the surface 121 may include an active surface and the surface 122 may include a backside surface. In some embodiments, an electrical signal may be transmitted through the active surface (e.g., the surface 121). For example, a signal path may pass through the active surface (e.g., the surface 121). For example, the surface 121 may include a circuit region. The circuit region may be configured to transmit a signal to the carrier 10 and/or to receive a signal from the carrier 10.

In some embodiments, the active device 12 may include a conductive via 12V. In some embodiments, the conductive via 12V may extend between the surface 121 and the surface 122. In some embodiments, the conductive via 12V may provide electrical connections between the interconnection structure 11 and a power regulating device (such as the power regulating device 14, if present) disposed on the active device 12.

Similarly, the positions and number of the active devices in the electronic device 1 are not intended to limit the present disclosure. For example, there may be any number of the active devices in the electronic device 1 due to design requirements.

To decrease the package size of the electronic device 1 and save power, the one or more power regulating devices (or power regulators) 13, 14, 15, and 16 may be integrated in the electronic device 1.

In some embodiments, the power regulating devices 13, 14, 15, and 16 may each include a power management integrated circuit (PMIC). The power regulating devices 13, 14, 15, and 16 may each be configured to provide different types of power control to different parts of the electronic device 1. For example, the power regulating devices 13, 14, 15, and 16 may each be configured to provide regulated power to the active devices 12 and/or 12'. For example, the power regulating devices 13, 14, 15, and 16 may each be configured to provide different output voltages to the active devices 12 and/or 12'.

In some embodiments, the power regulating devices 13, 14, 15, and 16 may each include a voltage regulator, such as a linear regulator (which is configured to maintain a constant output voltage) or a switching regulator (which is configured to generate an output voltage higher than or lower than the input voltage).

In some embodiments, the power regulating devices 13, 14, 15, and 16 may each include a step-down (buck) converter, a step-up (boost) converter, an analog-to-digital converter, a digital-to-analog converter, an AC-DC converter, a DC-DC converter, other types of converters, or a combination thereof.

The power regulating devices 13, 14, 15, and 16 may be disposed at different locations on the carrier 10. The supply power (from a power supply to the carrier 10) may be transmitted to the power regulating devices 13, 14, 15, and 16 as an input power (or an input voltage) through the carrier 10. The power regulating devices 13, 14, 15, and 16 may receive the input power, regulate the input power, and then provide an output power (or an output voltage) to the active devices. Depending on the different locations of the power regulating devices 13, 14, 15, and 16, the power paths between the power regulating devices and the active devices may be varied.

For example, the power regulating device 16 may be disposed on the surface 101 of the carrier 10. For example, the power regulating device 16 and the active device 12 may be disposed on opposite sides of the carrier 10. In such an arrangement, the output power may be transmitted from the power regulating device 16 to the active device 12 in a direction substantially perpendicular to the surface 101 of the carrier 10.

In another example, the power regulating device 13 (and/or the power regulating device 15) and the active device 12 may be disposed on the same side of the carrier 10. For example, the power regulating device 13 may be disposed adjacent to the active device 12. In such a side-by-side arrangement, the output power may be transmitted from the power regulating device 13 to the active device 12 in a direction substantially parallel to the surface 101 of the carrier 10. In comparison with the power regulating device 16, the power path for the power regulating device 13 (and/or the power regulating device 15) may be shorter, the supply power for the power regulating device 13 (and/or the power regulating device 15) may be lower, and thus the side-by-side arrangement may save power.

In still another example, the power regulating device 14 may be disposed on the active device 12. In such a stacking arrangement, the supply power may be transmitted from the power supply to the interconnection structure 11, the active device 12, and then to the power regulating device 14. The output power from the power regulating device 14 may be transmitted to the active device 12 from the backside surface (e.g., the surface 122) of the active device 12. In comparison with the power regulating devices 16, 13, and 15, the power path for the power regulating device 14 may be shorter, the supply power for the power regulating device 14 may be lower, and thus the stacking arrangement may save power. In addition, no additional pin on the carrier 10 is needed. Furthermore, heat dissipation efficiency may be enhanced. In some embodiments, a circuit (such as a RDL) may be formed on the surface 122 of the active device 12. The power regulating device 14 may be electrically connected with the conductive via 12V through the circuit on the surface 122.

It is to be noted that the positions and number of the power regulating devices in the electronic device 1 are not intended to limit the present disclosure. For example, there may be any number of the power regulating devices in the electronic device 1 due to design requirements. For example, one or more of the power regulating devices 13, 14, 15, and 16 may be omitted. For example, one or more of the power regulating devices 13, 14, 15, and 16 may be accomplished by an individual device.

In some embodiments, passive devices (or passive components) may be integrated in the carrier 10. The passive devices may be circuits or circuit elements that do not need an external power source to function and do not provide electrical gain. In some embodiments, the passive devices may be present in the power paths between the power regulating devices and the active devices. In some embodiments, the passive devices may be electrically connected with the power regulating devices 13, 14, 15, and 16. In some embodiments, the passive devices may function with the power regulating devices 13, 14, 15, and 16 to provide different types of power control to different parts of the electronic device 1. Depending on the different locations of the power regulating devices 13, 14, 15, and 16, the locations of the passive devices may be varied.

For example, inductance devices (or inductors) 10L and capacitance device (or capacitors) 10C, may be integrated in the semiconductor substrate 10a and/or the RDL 10b of the carrier 10. Other examples of passive devices may include, for example, resistors, diodes, fuses or antifuses, etc., and may be included along with the inductance devices 10L and the capacitance device 10C in any combination as part of the carrier 10. Alternatively, or additionally, the inductance devices 10L and capacitance device 10C may be discrete components disposed on the carrier 10.

As another example, a capacitance device 11C may be integrated in the interconnection structure 11. In some embodiments, the capacitance device 11C may be physically spaced apart from the conductive via 11V. In some embodiments, the capacitance device 11C may be proximal to or adjacent to the surface 112. In some embodiments, the capacitance device 11C may be electrically connected with the active device 12. The capacitance device 11C may be spaced apart from the power regulating device 14 through the active device 12. In some embodiments, the capacitance device 11C may include a deep trench capacitor (DTC), a multi-layer ceramic capacitor (MLCC) or other capacitors. Other passive devices may be included along with the capacitance device 11C in any combination as part of the interconnection structure 11. Alternatively, or additionally, the capacitance device 11C may be a discrete component disposed on the carrier 10. In some embodiments, the capacitance device 11C may be disposed in the power path between the active device 12 and the power regulating device 14.

Figure 2:
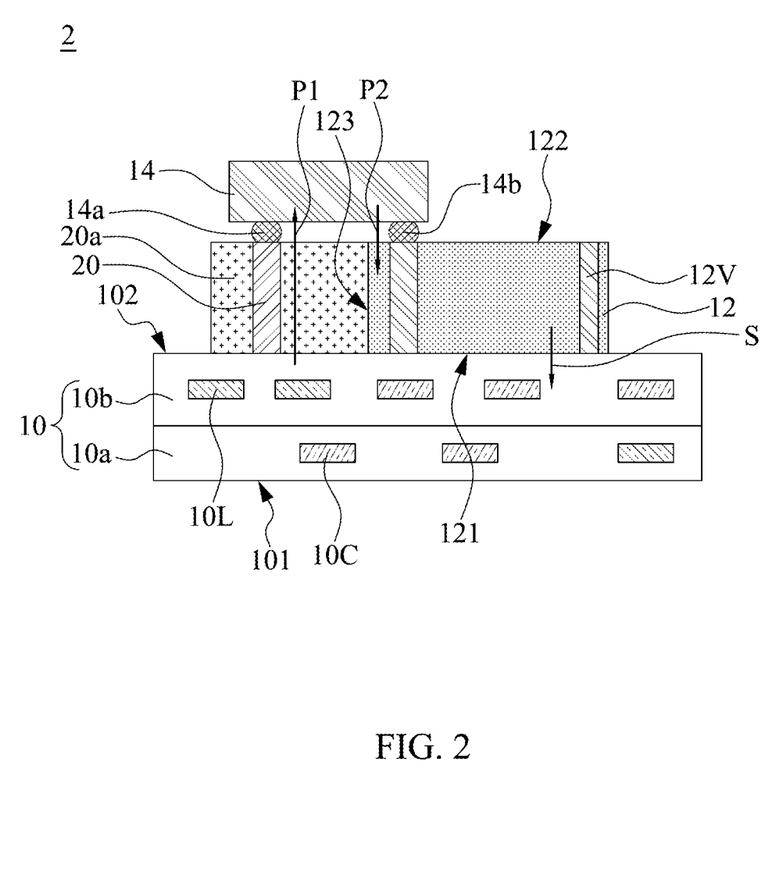
FIG. 2 illustrates a cross-sectional view of an example of an electronic device according to some embodiments of the present disclosure.

FIG. 2 illustrates a cross-sectional view of an example of an electronic device 2 according to some embodiments of the present disclosure. The electronic device 2 is similar to the electronic device 1 in FIG. 1. Therefore, some detailed descriptions may refer to the corresponding paragraphs above and are not repeated hereinafter for conciseness.

In some embodiments, the electronic device 2 may include the carrier 10, the active device 12, the power regulating device 14, and a conductive element 20.

In some embodiments, the active device 12 may be disposed on the surface 102 of the carrier 10. In some embodiments, the active device 12 may be electrically connected with the carrier 10 through an electrical contact, such as solder balls. In some embodiments, the active device 12 may be directly electrically connected with the carrier 10 without an interconnection structure (such as the interconnection structure 11 in FIG. 1).

In some embodiments, the active device 12 may include the surface 121 facing the carrier 10, the surface 122 opposite to the surface 121, and a surface (or a lateral surface) 123 extending between the surface 121 and the surface 122. In some embodiments, the surface 121 may include an active surface and the surface 122 may include a backside surface. In some embodiments, the active device 12 may include the conductive via 12V. In some embodiments, the conductive via 12V may extend between the surface 121 and the surface 122.

In some embodiments, the conductive element 20 may be disposed on the surface 102 of the carrier 10 and spaced apart from the active device 12. In some embodiments, the conductive element 20 may be disposed adjacent to the surface 123 of the active device 12. In some embodiments, the surface 123 of the active device 12 may face the conductive element 20.

In some embodiments, the conductive element 20 may include conductive materials, such as copper (Cu), tin (Sn), aluminum (Al), gold (Au), silver (Ag), tungsten (W), nickel (Ni), or other suitable materials. In some embodiments, the conductive element 20 may include a conductive via or a conductive pillar penetrating through an encapsulant 20a. For example, the conductive element 20 may be surrounded or partially covered by the encapsulant 20a. In some embodiments, the encapsulant 20a may be configured to support and protect the conductive element 20.

In some embodiments, the encapsulant 20a may be disposed on the surface 102 of the carrier 10. In some embodiments, the encapsulant 20a may be adjacent to the active device 12. In some embodiments, the surface 123 of the active device 12 may face the encapsulant 20a. The encapsulant 20a may cover the active device 12. The surface 122 of the active device 12 may be exposed from the encapsulant 20a. In some embodiments, the encapsulant 20a may be in contact with the surface 123 of the active device 12.

In some embodiments, the encapsulant 20a may include an epoxy resin having fillers, a molding compound (e.g., an epoxy molding compound or another molding compound), a polyimide, a phenolic compound or material, a material with a silicone dispersed therein, or a combination thereof.

In some embodiments, the power regulating device 14 may be disposed adjacent to the active device 12. In some embodiments, the power regulating device 14 may be disposed on (over, or above) the backside surface (e.g., the surface 122) of the active device 12. In some embodiments, the power regulating device 14 and the active device 12 may be partially overlapping in a direction substantially perpendicular to the surfaces 101 and/or 102 of the carrier 10. For example, a projection area of the power regulating device 14 on the surface 102 of the carrier 10 and a projection area of the active device 12 on the surface 102 of the carrier 10 may be partially overlapping. For example, a projection area of the power regulating device 14 on the surface 102 of the carrier 10 may not be fully within a projection area of the active device 12 on the surface 102 of the carrier 10. In some embodiments, the power regulating device 14 may extend over and beyond the surface 123 of the active device 12. For example, the power regulating device 14 may have an overhang structure extending from the active device 12.

In some embodiments, the power regulating device 14 may be disposed on the active device 12 and the conductive element 20. For example, the power regulating device 14 may be supported by the active device 12 and the conductive element 20. For example, the power regulating device 14 may be disposed partially over the active device 12 and partially over the conductive element 20. In some embodiments, the power regulating device 14 may be electrically connected with the active device 12 and the conductive element 20. In some embodiments, a circuit (such as a RDL) may be formed on the encapsulant 20a. The power regulating device 14 may be electrically connected with the conductive element 20 through the circuit on the encapsulant 20a.

In some embodiments, the power regulating device 14 may be electrically connected with the carrier 10 through the conductive element 20. In some embodiments, the power regulating device 14 may be configured to receive an input power from the carrier 10 through the conductive element 20 and an input terminal 14a. The arrow of the denotation "P1" shown in FIG. 2 indicates an input power path.

In some embodiments, the supply power (from a power supply to the carrier 10) may be transmitted to the power regulating device 14 through the input power path P1 as an input power. In some embodiments, the input power path P1 may be configured to provide an input power from the carrier 10 to the power regulating device 14.

In some embodiments, the input power path P1 may extend along the surface 123 of the active device 12. In some embodiments, the input power path P1 may not pass through the active device 12. In some embodiments, the input power path P1 may be spaced apart from the active device 12. In some embodiments, the input power path P1 may be outside of the active device 12. In some embodiments, the input power path P1 may be free from passing the active device 12. In some embodiments, the input power may be free from passing the active device 12.

In some embodiments, the power regulating device 14 may be electrically connected with the active device 12 through an output terminal 14b and the conductive via 12V. In some embodiments, the power regulating device 14 may be configured to provide an output power from the backside surface (e.g., the surface 122) of the active device 12 through the output terminal 14b. The arrow of the denotation "P2" shown in FIG. 2 indicates an output power path.

In some embodiments, the output power (from the output terminal 14b of the power regulating device 14) may be transmitted to the active device 12 through the output power path P2. In some embodiments, the output power path P2 may be configured to provide an output power from the power regulating device 14 to the active device 12.

In some embodiments, the output power may be different from the input power. In some embodiments, the output power may be a regulated power generated by the power regulating device 14 in response to the input power. In some embodiments where the power regulating device 14 is a step-down (buck) converter, the voltage of the output power may be less than the voltage of the input power. In some embodiments where the power regulating device 14 is a step-up (boost) converter, the voltage of the output power may be greater or larger than the voltage of the input power. In some embodiments where the power regulating device 14 is a linear regulator, the variation of the voltage of the output power may be less than the variation of the voltage of the input power.

In some embodiments, the active surface (e.g., the surface 121) of the active device 12 may be closer to the carrier 10 than to the power regulating device 14. In some embodiments, a circuit region of the active device 12 may be closer to the carrier 10 than to the power regulating device 14. The circuit region may be configured to transmit a signal to the carrier 10 and/or to receive a signal from the carrier 10.

In some embodiments, the active device 12 may be configured to transmit a signal to the carrier 10 and/or to receive a signal from the carrier 10 through the active surface (e.g., the surface 121). In some embodiments, the active device 12 may be configured to receive an output power from the power regulating device 14 through the backside surface (e.g., the surface 122).

The arrow of the denotation "S" shown in FIG. 2 indicates a signal path. In some embodiments, the signal may be transmitted to the carrier 10 through the signal path S. In some embodiments, the signal path S may be configured to provide a signal from the active device 12 to the carrier 10. In some embodiments, the signal path S may be free from passing through the power regulating device 14. In some embodiments, the signal may be free from passing through the power regulating device 14.

As used herein, a signal path may refer to a path through which an electrical signal may be transmitted. Such an electrical signal may include either analog or digital signals. Additionally, a power path, as used and described herein, may refer to a path dedicated to power supply connections.

In some embodiments, the carrier 10 may include a circuit region configured to transmit a signal to the active device 12 and/or receive a signal from the active device 12 through the signal path S. In some embodiments, the carrier 10 may include another circuit region configured to provide a power to the active device 12 through the power path P1. The circuit region configured to transmit and/or receive a signal and the circuit region configured to provide a power may be different circuit regions.

In some embodiments, a passive device (such as an inductance device and/or a capacitance device) may be integrated in the power regulating device 14. In some embodiments, the passive device may be inside of the power regulating device 14. In some embodiments, the passive device may be present in the output power path P2. For example, the passive device may be electrically connected with the output terminal 14b of the power regulating device 14.

In some embodiments, the inductance devices 10L and the capacitance device 10C in the semiconductor substrate 10a and/or the RDL 10b of the carrier 10 may be omitted. Alternatively, or additionally, the inductance devices 10L and capacitance device 10C may be discrete components disposed on the carrier 10.

According to some embodiments of the present disclosure, by stacking the power regulating device 14 on the active device 12, the power path can be shorter than if disposing the power regulating device 14 on the surfaces 101 and/or 102 of the carrier 10. Therefore, the supply power for the power regulating device 14 can be lower. In addition, no additional pin on the carrier 10 is needed. Furthermore, heat dissipation efficiency may be enhanced.

In addition, by using the input power path P1 outside of the active device 12, the input power can be transmitted from the carrier 10 to the power regulating device 14 without consuming input/output (I/O) pins on the surface 121 of the active device 12, and thus more I/O pins can be used to transmit signals. Therefore, the performance of the electronic device 2 can be enhanced.

Figure 3:
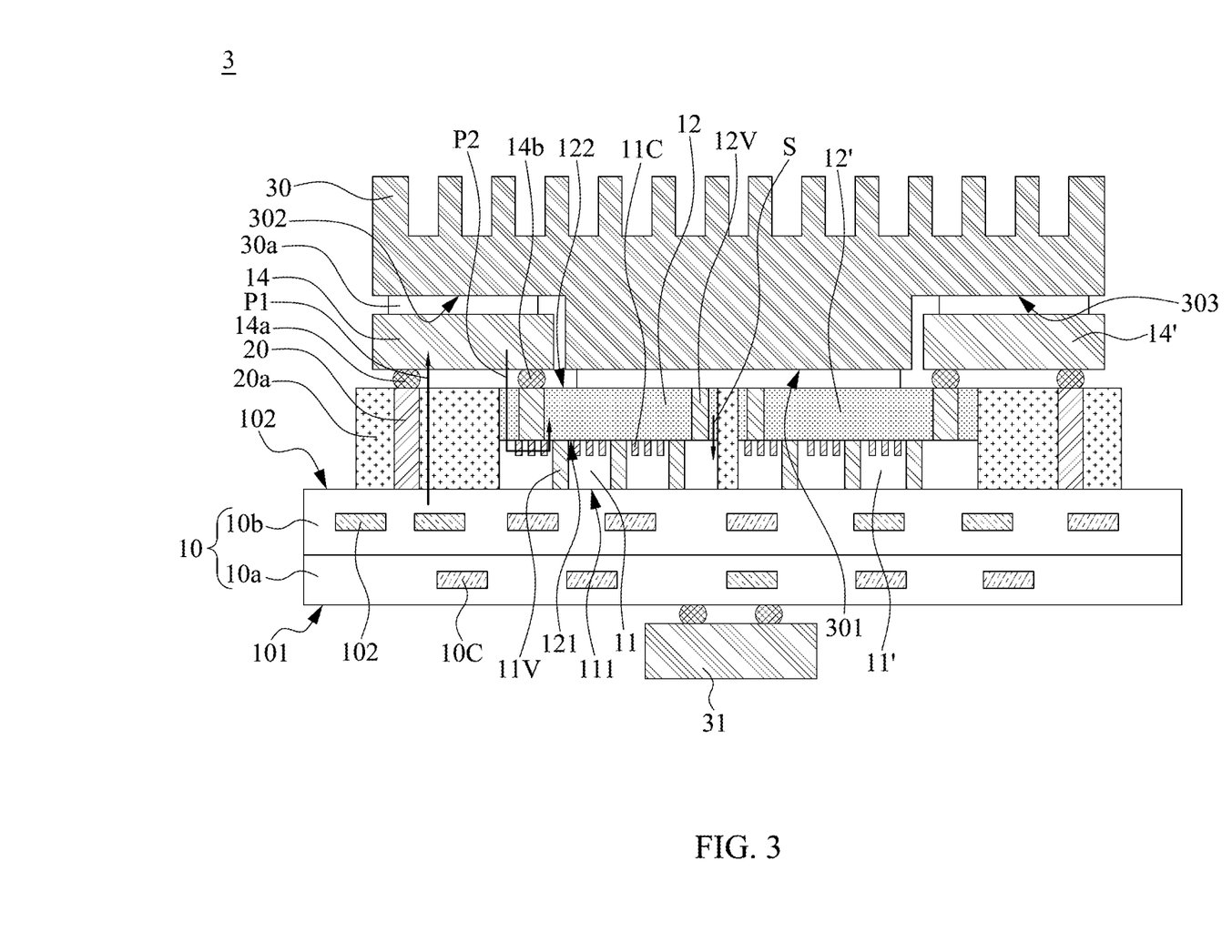
FIG. 3 illustrates a cross-sectional view of an example of an electronic device according to some embodiments of the present disclosure.

FIG. 3 illustrates a cross-sectional view of an example of an electronic device 3 according to some embodiments of the present disclosure. The electronic device 3 is similar to the electronic device 1 in FIG. 1 and the electronic device 2 in FIG. 2. The electronic device 3 may be a combination of the electronic device 1 in FIG. 1 and the electronic device 2 in FIG. 2. Therefore, some detailed descriptions may refer to the corresponding paragraphs above and are not repeated hereinafter for conciseness.

In the electronic device 3, the active device 12 is electrically connected with the carrier 10 through the interconnection structure 11. A passive device (such as the capacitance device 11C) may be integrated in the interconnection structure 11. In some embodiments, the capacitance device 11C may be disposed between the active device 12 and the carrier 10. In some embodiments, the capacitance device 11C may be proximal to or adjacent to the surface 112. In some embodiments, the capacitance device 11C may be electrically connected with the conductive via 12V of the active device 12. In some embodiments, the capacitance device 11C may be present in the output power path P2. For example, the capacitance device 11C may be electrically connected with the output terminal 14b of the power regulating device 14.

As denoted with the output power path P2, the output power (from the output terminal 14b of the power regulating device 14) may be transmitted from the backside (e.g., the surface 122) of the active device 12, passing through the active device 12, and then to the interconnection structure 11. Then, the output power may return back to the active device 12 from the active surface (e.g., the surface 121) of the active device 12.

Similarly, the power regulating device 14' may be configured to receive an input power from the carrier 10 and provide an output power to the active device 12'.

By using the interconnection structure 11, more active devices can be integrated in the electronic device 3. In addition, the capacitance device 11C and the power regulating device 14 can be manufactured separately, which can help increase the process yield.

In some embodiments, the electronic device 3 may include a heat sink 30, such as heat dissipation fins. The heat sink 30 may be disposed over a part of the active device 12. The heat sink 30 may be disposed over the power regulating device 14. The heat sink 30 may be configured to provide a heat dissipation path. The heat sink 30 may be configured to dissipate heat from the power regulating device 14 and the active device 12 to external of the electronic device 3. In some embodiments, at least a part of the heat sink 30 may be disposed on the power regulating device 14 and the active device 12. In some embodiments, the heat sink 30 may be connected to the power regulating device 14 and the active device 12 through an adhesive layer 30a, such as a heat dissipation gel. In some embodiments, the heat sink 30 may have or define a space for accommodating the power regulating device 14. For example, the heat sink 30 may have a lower surface 301, a lower surface 302 spaced apart from the lower surface 301, and a lower surface 303 spaced apart from the lower surface 302. The lower surface 301 protrudes from the lower surface 302 and the lower surface 303.

The lower surface 301 and the lower surface 302 define a space for accommodating the power regulating device 14. The lower surface 301 and the lower surface 303 define a space for accommodating the power regulating device 14'. The lower surface 301 is connected with an upper surface of the active device 12. The lower surface 302 is connected with an upper surface of the power regulating device 14. The lower surface 303 is connected with an upper surface of the power regulating device 14'.

In some embodiments, the electronic device 3 may further include another power regulating device, such as a power regulating device 31 disposed on the surface 101 of the carrier 10. In some embodiments, the inductance devices 10L and the capacitance device 10C in the carrier 10 may be present in the power path for the power regulating device 31. It is to be noted that the positions and number of the power regulating devices in the electronic device 3 are not intended to limit the present disclosure.

Figure 4:
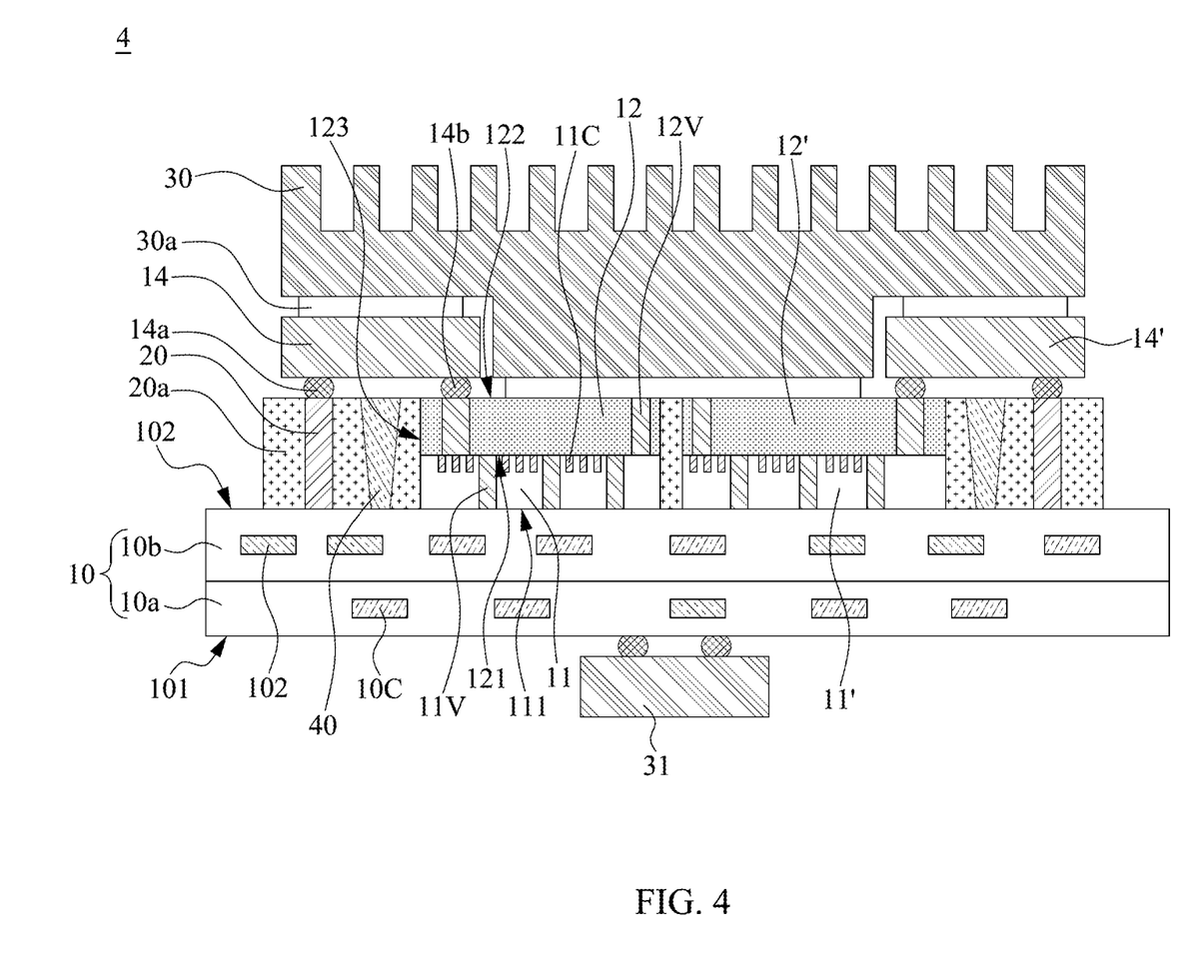
FIG. 4 illustrates a cross-sectional view of an example of an electronic device according to some embodiments of the present disclosure.

FIG. 4 illustrates a cross-sectional view of an example of an electronic device 4 according to some embodiments of the present disclosure. The electronic device 4 is similar to the electronic device 3 in FIG. 3 except for the differences described as follows.

The electronic device 4 further includes a shielding element 40. In some embodiments, the shielding element 40 may be configured to provide an electromagnetic interference (EMI) shielding protection for the active device 12. For example, the shielding element 40 may be configured to provide an EMI shielding to prevent the active device 12 from interference by other electronic components, and vice versa.

In some embodiments, the shielding element 40 may be surrounded or partially covered by the encapsulant 20a. In some embodiments, the shielding element 40 may be spaced apart from the conductive element 20. In some embodiments, the shielding element 40 may be disposed between the conductive element 20 and the surface 123 of the active device 12. In some embodiments, the shielding element 40 may be insulated from the conductive element 20. In some embodiments, the shielding element 40 may be connected to a ground. The shielding element 40 may be formed along one or more sides of the active device 12. For example, the shielding element 40 may be a continuous or discontinuous wall around one or more sides of the active device 12. The shielding element 40 may be formed by filling conductive material in a trench. In some embodiments, the trench may be formed in the encapsulant 20a by, for example, a laser cutting process and may have a tapered shape or profile.

There may be more than one encapsulants 20a and more than one shielding elements 40 in the electronic device 4. In a top view, the shielding elements 40 may be disposed on opposite sides of the active device 12. The encapsulants 20a may be disposed on opposite sides of the active device 12.

Figure 5:
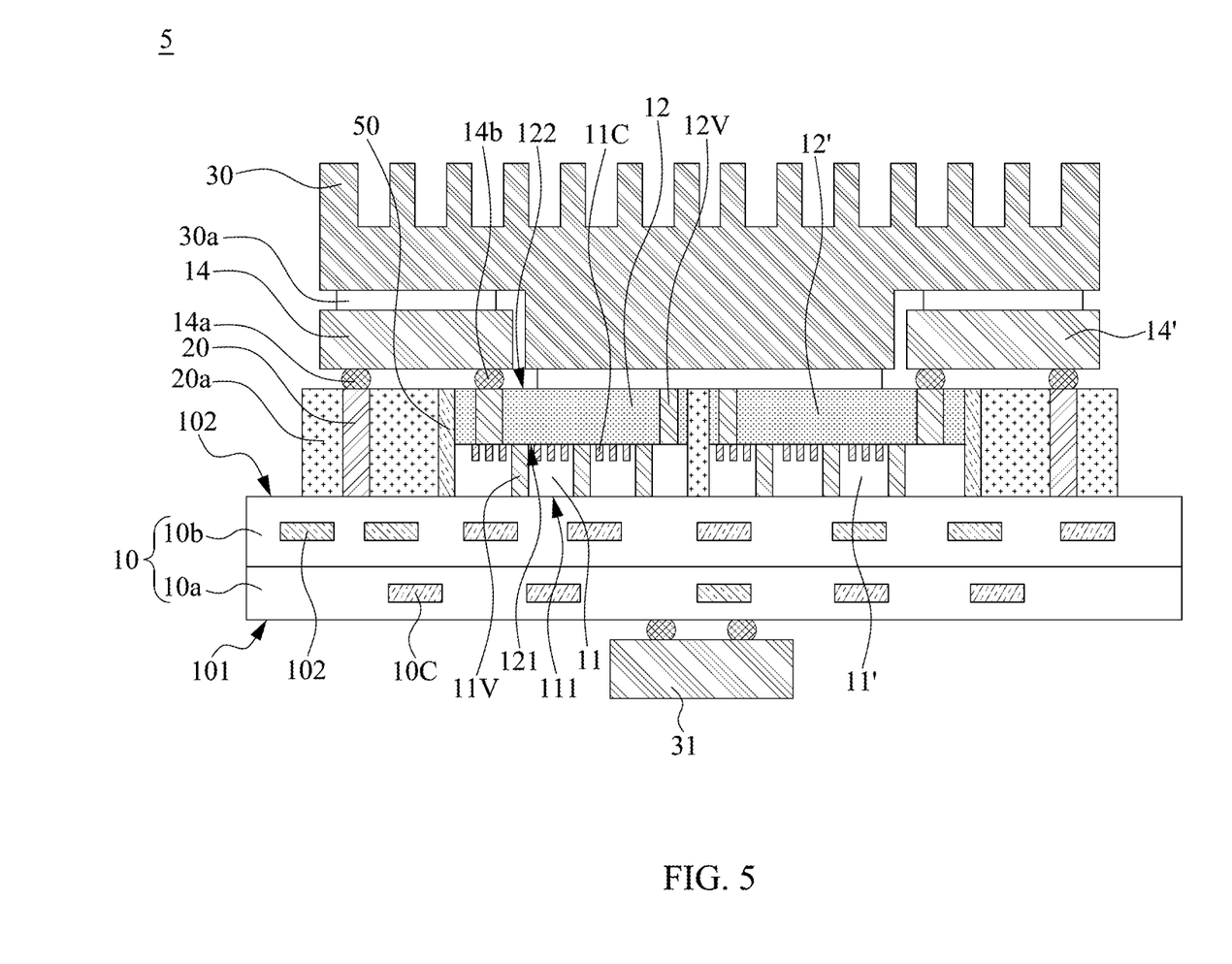
FIG. 5 illustrates a cross-sectional view of an example of an electronic device according to some embodiments of the present disclosure.

FIG. 5 illustrates a cross-sectional view of an example of an electronic device 5 according to some embodiments of the present disclosure. The electronic device 5 is similar to the electronic device 3 in FIG. 3 except for the differences described as follows.

The electronic device 4 further includes a shielding element 50. In some embodiments, the shielding element 50 may be formed on the surface 123 of the active device 12. In some embodiments, the shielding element 50 may be or include a conductive layer or a conductive thin film. In some embodiments, the shielding element 50 may be implemented using a conformal molding with a sputtered shield.

In some embodiments, the shielding element 40 and the shielding element 50 may each include copper (Cu) or other conductive materials, such as aluminum (Al), chromium (Cr), tin (Sn), gold (Au), silver (Ag), nickel (Ni) or stainless steel, another metal, or a mixture, an alloy, or other combinations of two or more thereof.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a first electronic component;
a first power regulator disposed above the first electronic component, wherein the first power regulator is configured to receive a first power along a lateral surface of the first electronic component without passing the first electronic component and to provide a second power to the first electronic component; and
a passive component disposed in an electrical path between the first electronic component and the first power regulator.

2. The electronic device of claim 1, wherein the passive component comprises a capacitance device.

3. The electronic device of claim 1, wherein the passive component is spaced apart from the first power regulator by the first electronic component.

4. The electronic device of claim 1, further comprising:
an interposer disposed below the first electronic component, wherein the passive component is integrated in the interposer.

5. The electronic device of claim 4, further comprising:
a carrier disposed below the first electronic component, wherein the first electronic component is electrically connected to the carrier by the interposer.

6. The electronic device of claim 1, further comprising:
a carrier and a conductive element connecting the first power regulator with the carrier and configured to transmit the first power, wherein the conductive element is spaced apart from the first electronic component.

7. The electronic device of claim 1, wherein a voltage of the first power is greater than a voltage of the second power.

8. The electronic device of claim 1, wherein the first power regulator extends over and beyond the lateral surface of the first electronic component.

9. The electronic device of claim 8, further comprising:
a heat sink having a space for accommodating the first power regulator, wherein at least a part of the heat sink is disposed over the first power regulator and the first electronic component.

10. The electronic device of claim 1, further comprising:
a second electronic component adjacent to the first electronic component; and
a second power regulator disposed above the second electronic component, wherein the second power regulator is configured to receive a third power along a lateral surface of the second electronic component without passing the second electronic component and to provide a fourth power to the second electronic component.

11. An electronic device, comprising:
a first electronic component;
a first power regulator disposed above the first electronic component; and
an encapsulant covering the first electronic component and exposing a top surface of the first electronic component;
wherein the first power regulator is configured to receive a first power passing the encapsulant and to provide a second power to the first electronic component.

12. The electronic device of claim 11, further comprising:
a conductive element passing through the encapsulant and spaced apart from the first electronic component, wherein the conductive element is configured to transmit the first power.

13. The electronic device of claim 12, further comprising:
a shielding element disposed between the conductive element and the first electronic component.

14. The electronic device of claim 11, wherein the first power regulator and the first electronic component are partially overlapping in a direction substantially perpendicular to a surface of a carrier on which the first electronic component is disposed.

15. The electronic device of claim 11, further comprising:
a heat sink having a space for accommodating the first power regulator, wherein at least a part of the heat sink is disposed over the first power regulator and the first electronic component.

16. The electronic device of claim 11, further comprising:
a second electronic component covered by the encapsulant and having a top surface exposed from the encapsulant; and
a second power regulator disposed above and electrically connected with the second electronic component, wherein the second power regulator is configured to receive a third power along a lateral surface of the second electronic component without passing the second electronic component and to provide a fourth power to the second electronic component.

17. An electronic device, comprising:
a first electronic component;
a first power regulator disposed above and exposing a portion of the first electronic component; and
a heat sink disposed over the portion of the first electronic component and the first power regulator, wherein the heat sink is configured to dissipate heat from the first electronic component and the first power regulator to external of the electronic device.

18. The electronic device of claim 17, wherein the heat sink comprises a first lower surface and a second lower surface defining a first space for accommodating the first power regulator, and wherein the first lower surface is connected with an upper surface of the first electronic component and the second lower surface is connected with an upper surface of the first power regulator.

19. The electronic device of claim 18, further comprising:
a second electronic component adjacent to the first electronic component, wherein a top surface of the second electronic component is connected with the first lower surface.

20. The electronic device of claim 19, further comprising:
a second power regulator partially disposed over the second electronic component;
wherein the heat sink comprises a third lower surface defining a second space with the first lower surface for accommodating the second power regulator; and
wherein a top surface of the second power regulator is connected with the third lower surface.

\* \* \* \* \*